(12) United States Patent
Lai et al.

(10) Patent No.: US 12,538,577 B2
(45) Date of Patent: Jan. 27, 2026

(54) ARRAY SUBSTRATE, MANUFACTURING METHOD THEREOF, AND DISPLAY DEVICE

(71) Applicant: Guangzhou China Star Optoelectronics Semiconductor Display Technology Co., Ltd., Guangdong (CN)

(72) Inventors: Kuhuang Lai, Guangdong (CN); Huaipei Wang, Guangdong (CN)

(73) Assignee: GUANGZHOU CHINA STAR OPTOELECTRONICS SEMICONDUCTOR DISPLAY TECHNOLOGY CO., LTD., Guangzhou (CN)

(*) Notice: Subject to any disclaimer, the term of this patent is extended or adjusted under 35 U.S.C. 154(b) by 389 days.

(21) Appl. No.: 18/193,776

(22) Filed: Mar. 31, 2023

(65) Prior Publication Data
US 2024/0258342 A1   Aug. 1, 2024

(30) Foreign Application Priority Data
Jan. 31, 2023   (CN) .......................... 202310075240.7

(51) Int. Cl.
*H10D 86/60*  (2025.01)
*H10D 86/01*  (2025.01)
*H10D 86/40*  (2025.01)

(52) U.S. Cl.
CPC ......... *H10D 86/60* (2025.01); *H10D 86/0231* (2025.01); *H10D 86/471* (2025.01)

(58) Field of Classification Search
CPC ... H10D 86/60; H10D 86/0231; H10D 86/471
See application file for complete search history.

(56) References Cited

U.S. PATENT DOCUMENTS 8,367,488 B2 *  2/2013  Ichiryu ............. H10D 30/6743
                                                  438/151
9,093,988 B2 *  7/2015  Yamazaki .............. H10D 84/85
(Continued)

FOREIGN PATENT DOCUMENTS

CN   114530495 A    5/2022
JP   2022189709 A   12/2022

OTHER PUBLICATIONS

Japanese Office Action issued in corresponding Japanese Patent Application No. 特願2023-202788 dated Aug. 6, 2024, pp. 1-4.

*Primary Examiner* — Eugene Lee
(74) *Attorney, Agent, or Firm* — Nathan & Associates Patent Agents Ltd.; Menachem Nathan

(57) ABSTRACT

Embodiments of the present application provide an array substrate, a manufacturing method thereof, and a display device. The array substrate includes a substrate and a Demux circuit disposed on the substrate, wherein the Demux circuit includes a first gate, a second gate, a first active layer, a second active layer, a first source, a second source, the first drain, and the second drain. The embodiments of the present application set the first gate and the second gate to be stacked in a direction perpendicular to the substrate, and the first active layer and the second active layer are set to be stacked in the direction perpendicular to the substrate, which can significantly reduce the occupied area of the Demux circuit in the horizontal direction.

17 Claims, 3 Drawing Sheets

(56) References Cited

U.S. PATENT DOCUMENTS

| | | | |
|---|---|---|---|
| 9,111,795 B2* | 8/2015 | Ieda | H10D 1/68 |
| 9,818,765 B2* | 11/2017 | Osawa | H10D 86/421 |
| 9,891,479 B2* | 2/2018 | Uejima | G02F 1/134309 |
| 10,763,451 B2* | 9/2020 | Lius | H10K 10/46 |
| 11,997,883 B2* | 5/2024 | Yang | H10K 59/1213 |
| 2009/0078939 A1* | 3/2009 | Yamazaki | H10D 86/441 |
| | | | 257/E33.001 |
| 2009/0224330 A1* | 9/2009 | Hong | H10D 88/01 |
| | | | 438/455 |
| 2016/0064421 A1 | 3/2016 | Oh et al. | |
| 2018/0277614 A1* | 9/2018 | Ono | H10K 59/124 |
| 2020/0243570 A1* | 7/2020 | Choi | H10D 86/60 |
| 2022/0028947 A1* | 1/2022 | Han | H10K 59/1213 |
| 2022/0208797 A1 | 6/2022 | Lai et al. | |
| 2023/0074433 A1* | 3/2023 | Cho | H10D 30/6755 |
| 2024/0054961 A1* | 2/2024 | Shin | H10D 86/481 |
| 2024/0379690 A1* | 11/2024 | Yoshimoto | H10D 86/451 |

\* cited by examiner

ARRAY SUBSTRATE, MANUFACTURING METHOD THEREOF, AND DISPLAY DEVICE

CROSS REFERENCE TO RELATED APPLICATIONS

The disclosure is a US patent application which claims priority to Chinese patent application No. 202310075240.7, titled "ARRAY SUBSTRATE, MANUFACTURING METHOD THEREOF, AND DISPLAY DEVICE", filed with the National Intellectual Property Administration on Jan. 31, 2023, which is incorporated by reference in the present application in its entirety.

BACKGROUND OF DISCLOSURE

1. Field of Disclosure

The present application relates to the display field, and in particular to an array substrate, a manufacturing method thereof, and a display device.

2. Description of Related Art

With the development of display technology, consumers pursue the screen-to-body ratio of display devices and hope to have as large an active area (Active Area, AA) as possible in the smallest possible size. Correspondingly, the pursuit of miniaturizing the border area of the display device will finally achieve a narrow border display.

A demultiplexer (D multiplexer, Demux) is used to decompose a signal channel into multiple signal channels and is widely used in display devices. Demux circuits are usually set in the non-display area of the display device (that is, the border area), because the area occupied by the Demux circuit is relatively large, resulting in a large frame width of the display device, which does not conform to the current mainstream trend of narrow frame display.

SUMMARY

Embodiments of the present application provide an array substrate, a manufacturing method thereof, and a display device, which can reduce the width of a frame of the display device, thereby achieving a technical effect of realizing a narrow frame display.

In a first aspect, an embodiment of the present application provides an array substrate, comprising orderly stacked, a substrate, a first gate, a first gate insulating layer, a first active layer, a first interlayer dielectric layer, a second active layer, a second gate insulating layer, a second gate, a second interlayer dielectric layer, and a source-drain electrode layer; wherein the source-drain electrode layer includes a first source electrode, a second source electrode, a first drain electrode, and a second drain electrode;
wherein the first source electrode is electrically connected to the second source electrode, and the first source electrode is electrically connected to one end of the first active layer, the second source electrode is electrically connected to one end of the second active layer, and the first drain electrode is electrically connected to the other end of the first active layer, and the second drain electrode is electrically connected to the other end of the second active layer.

In some embodiments, when a current channel of the first active layer is turned on, a current channel of the second active layer is disconnected, and an electrical signal of the first source electrode is transmitted to the first drain electrode through the first active layer;
when the current channel of the second active layer is turned on, the current channel of the first active layer is disconnected, and an electrical signal of the second source electrode is transmitted to the second drain electrode through the second active layer.

In some embodiments, an orthographic projection of the first gate on the substrate and an orthographic projection of the second gate on the substrate at least partially overlap.

In some embodiments, an orthographic projection of the first active layer on the substrate and an orthographic projection of the second active layer on the substrate at least partially overlap.

In some embodiments, a first via hole and a second via hole are formed in the second interlayer dielectric layer, the second gate insulating layer, and the first interlayer dielectric layer, the first source electrode is connected to the first active layer through the first via hole, the first drain electrode is connected to the first active layer through the second via hole;
a third via hole and a fourth via hole are formed in the second interlayer dielectric layer and the second gate insulating layer, and the second source electrode is connected to the second active layer via the third via hole. The second drain electrode is connected to the second active layer through the fourth via hole.

In some embodiments, the array substrate further comprises a first passivation layer, a planarization layer, and a second passivation layer; the first passivation layer covers the source-drain electrode layer, the planarization layer is arranged on one side of the first passivation layer away from the source-drain electrode layer, and the second passivation layer is arranged on one side of the planarization layer away from the first passivation layer.

In some embodiments, the substrate comprises a display area and a non-display area, the first gate, the second gate, the first active layer, the second active layer, the first source electrode, the second source electrode, the first drain electrode, and the second drain electrode all correspond to the non-display area of the substrate.

In some embodiments, the array substrate further comprises a common electrode and a pixel electrode, the common electrode is arranged between the planarization layer and the second passivation layer, the pixel electrode is disposed on one side of the second passivation layer away from the planarization layer, and both the common electrode and the pixel electrode correspond to the display area of the substrate.

In a second aspect, an embodiment of the present application provides a method for manufacturing an array substrate, comprising:
forming a substrate;
forming a first gate on the substrate;
forming a first gate insulating layer on the first gate and the substrate;
forming a first active layer on the first gate insulating layer;
forming a first interlayer dielectric layer on the first active layer and the first gate insulating layer;
forming a second active layer on the first interlayer dielectric layer;
forming a second gate insulating layer on the second active layer and the first interlayer dielectric layer;
forming a second gate on the second gate insulating layer;
forming a second interlayer dielectric layer on the second gate and the second gate insulating layer;

a source-drain electrode layer is formed on the second interlayer dielectric layer, and the source-drain electrode layer includes a first source electrode, a second source electrode, a first drain electrode, and a second drain electrode, wherein the first source electrode is electrically connected to the second source electrode, the first source electrode is electrically connected to one end of the first active layer, and the second source electrode is electrically connected to one end of the second active layer, the first drain electrode is electrically connected to the other end of the first active layer, and the second drain electrode is electrically connected to the other end of the second active layer.

In some embodiments, after the second interlayer dielectric layer is formed on the second gate and the second gate insulating layer, and before forming the source-drain electrode layer on the second interlayer dielectric layer, the manufacturing method of the array substrate further includes:

a first via hole and a second via hole are formed and spaced apart on the first interlayer dielectric layer, the second gate insulating layer, and the second interlayer dielectric layer, and a third via hole and a fourth via hole are formed and spaced apart on the second gate insulating layer and the second interlayer dielectric layer;

the first source electrode is connected to the first active layer through the first via hole, the first drain electrode is connected to the first active layer through the second via hole, the second source electrode is connected to the second active layer through the third via hole, and the second drain electrode is connected to the second active layer through the fourth via hole.

In some embodiments, the substrate includes a display area and a non-display area; the first gate, the second gate, the first active layer, the second active layer, the first source electrode, the second electrode source, the first drain electrode, and the second drain electrode all correspond to the non-display area of the substrate.

In some embodiments, after forming a source-drain electrode layer on the second interlayer dielectric layer, the method for manufacturing an array substrate further comprises:

forming a first passivation layer on the source-drain electrode layer and the second interlayer dielectric layer;

forming a planarization layer on one side of the first passivation layer away from the source-drain electrode layer;

forming a common electrode on the planarization layer, the common electrode is disposed corresponding to the display area of the substrate;

forming a second passivation layer on one side of the common electrode and the planarization layer away from the first passivation layer;

forming a pixel electrode on one side of the second passivation layer away from the planarization layer, and the pixel electrode is disposed corresponding to the display area of the substrate.

In a third aspect, an embodiment of the present application provides a display device, including the above-mentioned array substrate or an array substrate manufactured by the above-mentioned method for manufacturing an array substrate.

The array substrate provided in the embodiment of the present application includes a substrate and a Demux circuit provided on the substrate, wherein the Demux circuit includes a first gate, a second gate, a first active layer, a second active layer, a first source electrode, the second source electrode, a first drain electrode, and a second drain electrode. In the embodiment of the present application, the first gate and the second gate are stacked in a direction perpendicular to the substrate, and the first active layer and the second active layer are arranged to be stacked in the direction perpendicular to the substrate, which in comparison to an arrangement in the related art where the respective gates of the plurality of thin film transistors are arranged orderly in the horizontal direction and the respective the active layers of the plurality of thin film transistors are arranged sequentially in the horizontal direction, can significantly reduce the occupied area of the Demux circuit in the horizontal direction. Since the Demux circuit is usually arranged in the non-display area of the display device, the area of the non-display area on display device can be reduced, and the width of the frame of the display device can be reduced, so as to achieve the technical effect of realizing a narrow frame display.

DETAILED DESCRIPTION OF EMBODIMENTS

The technical solutions in the embodiments of the present application will be clearly and completely described below in conjunction with the drawings in the embodiments of the present application. Apparently, the described embodiments are only some of the embodiments of this application, not all of them. Based on the embodiments in this application, all other embodiments obtained by those skilled in the art without making creative efforts belong to the scope of protection of this application.

Figure 1:
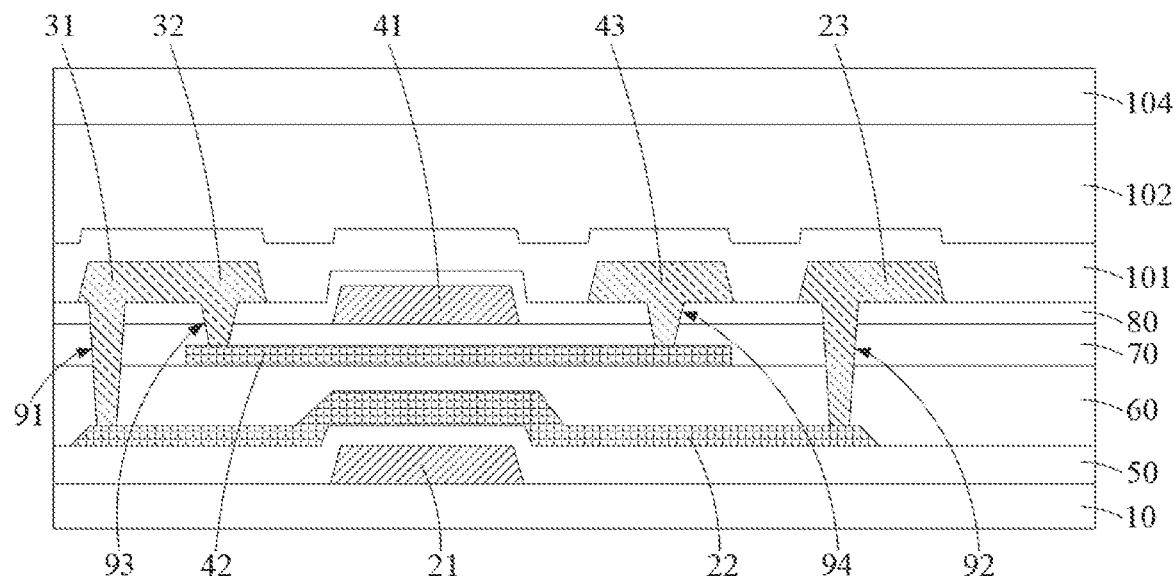
FIG. 1 is a schematic structural diagram of a non-display area of an array substrate provided by an embodiment of the present application.

With reference to FIG. 1, an embodiment of the present application provides an array substrate 100, including orderly stacked a substrate 10, a first gate 21, a first gate insulating layer 50, a first active layer 22, and a first interlayer dielectric layer 60, a second active layer 42, a second gate insulating layer 70, a second gate 41, a second interlayer dielectric layer 80, and a source-drain electrode layer.

In particular, the source-drain electrode layer includes a first source electrode 31, a second source electrode 32, a first drain electrode 23, and a second drain electrode 43, wherein the first source electrode 31 is electrically connected to the second source electrode 32, and the first source electrode 31 is electrically connected to one end of the first active layer 22, the second source electrode 32 is electrically connected to one end of the second active layer 42, the first drain electrode 23 is electrically connected to the other end of the first active layer 22, and the second drain electrode 43 is electrically connected to the other end of the second active layer 42.

The array substrate 100 provided in the embodiment of the present application includes a substrate 10 and a Demux circuit disposed on the substrate 10, wherein the Demux circuit includes a first gate 21, a second gate 41, a first active layer 22, a second The active layer 42, the first source electrode 31, the second source electrode 32, the first drain electrode 23 and the second drain electrode 43. In the embodiment of the present application, the first gate 21 and the second gate 41 are stacked in a direction perpendicular to the substrate 10, and the first active layer 22 and the second active layer 42 are stacked in a direction perpendicular to the substrate 10, which in comparison to a technical scheme in the related art where the respective gates of the plurality of thin film transistors are arranged orderly in the horizontal direction and the respective the active layers of the plurality of thin film transistors are arranged sequentially in the horizontal direction, can significantly reduce the occupied area of the Demux circuit in the horizontal direction. Since the Demux circuit is usually arranged in the non-display area of the display device, the area of the non-display area on display device can be reduced, and the width of the frame of the display device can be reduced, so as to achieve the technical effect of realizing a narrow frame display.

As can be appreciated, the embodiment of the present application can reduce the use of source chips by setting the Demux circuit in the array substrate, thereby effectively reducing the cost of the integrated circuit (IC). For example, a 14-inch full high-definition (14FHD) TV, before using the Demux circuit, needs 4 source ICs to achieve high-definition display effects while, after using the Demux circuit, needs only 1 to 2 source ICs to achieve the same display effect. Additionally, forming the Demux circuit in the array substrate can effectively reduce the product cost and increase the market competitiveness of the product. In addition, since the source IC is usually arranged at the lower frame area of the display device, when the number of source ICs decreases, the width of the lower frame for covering and shielding the source IC can be further reduced, thereby achieving the effect of reducing the width of the border the display device.

Figure 2:
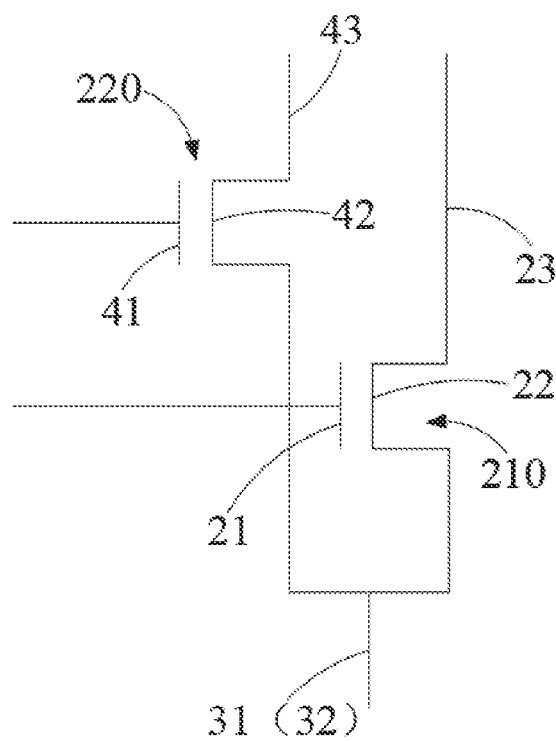
FIG. 2 is a schematic diagram showing a Demux circuit provided by an embodiment of the present application.

With reference to FIG. 1 and FIG. 2, the Demux circuit includes a first thin film transistor 210 and a second thin film transistor 220, and the first thin film transistor 210 includes a first gate 21, a first active layer 22, a first source electrode 31, and a first drain electrode 23, the second thin film transistor 220 includes a second gate 41, a second active layer 42, a second source electrode 32 and a second drain electrode 43, where the first source electrode 31 and the second source electrode 32 are electrically connected connect.

With reference to FIG. 2, when a current channel of the first active layer 22 is turned on, a current channel of the second active layer 42 is disconnected, and an electrical signal of the first source electrode 31 is transmitted through the first active layer 22 to the first drain electrode 23, at the same time when a voltage on the first gate 21 is greater than a voltage on the second gate 41;

When a current channel of the second active layer 42 is turned on, a current channel of the first active layer 22 is disconnected, and an electrical signal of the second source electrode 32 is transmitted through the second active layer 42 to the second drain electrode 43, at the same time, the voltage on the second gate 41 is greater than the voltage on the first gate 21.

With reference to FIG. 1, an orthographic projection of the first gate 21 on the substrate 10 and an orthographic projection of the second gate 41 on the substrate 10 at least partially overlap. It can be understood that the arrangement where an orthographic projection of the first gate 21 on the substrate 10 partially overlaps with the orthographic projection of the second gate 41 on the substrate 10, when compared with the technical solution in which the orthographic projection of the first gate 21 on the substrate 10 and the orthographic projection of the second gate 41 on the substrate 10 does not overlap at all, can reduce the occupied area of the Demux circuit in the horizontal direction (parallel to the display surface), thereby facilitating the realization of narrow border display. In some embodiments, the orthographic projection of the first gate 21 on the substrate 10 and the orthographic projection of the second gate 41 on the substrate 10 overlap completely (100%). At the same time, the occupied area of the Demux circuit in the horizontal in the direction (parallel to the display surface) can be minimized to realize the extremely narrow bezel display.

For example, a ratio of an area of an overlapping portion to an area of the orthographic projection of the first gate 21 on the substrate 10 or to an area of the orthographic projection of the second gate 41 on the substrate 10 may be 10% to 100%, such as 10%, 20%, 30%, 40%, 50%, 60%, 70%, 80%, 90%, 95%, 99%, 100%, etc., where the overlapping portion is an overlapping portion of the orthographic projection of the first gate 21 on the substrate 10 and the orthographic projection of the second gate 41 on the substrate 10.

Referring to FIG. 1, it can be seen that the first gate 2 is disposed below the first active layer 22 to form a bottom gate, and the second gate 41 is disposed above the second active layer 42 to form a top gate. That is to say, the embodiment of the present application adopts a combination of the top gate structure and the bottom gate structure to realize the design of the Demux circuit as a three-dimensional structure extending in the vertical direction (perpendicular to the display surface), thereby reducing the area occupied by the Demux circuit on the horizontal plane (parallel to the display surface), thereby realizing the narrow frame design of the display device.

It is worth mentioning that although the embodiment of the present application uses the Demux circuit including two thin film transistors (the first thin film transistor 210 and the second thin film transistor 220) as an example, it should be noted that the Demux circuit in the embodiment of the present application may include more thin film transistors, for example, 3, 4, 5 or 6 thin film transistors. Because the respective gates of the plurality of thin film transistors and the respective active layers of the plurality of thin film transistors are formed in the direction perpendicular to the substrate 10, that is to say, no matter how many thin film transistors the Demux circuit includes, the occupied area of the Demux circuit in the horizontal direction (parallel to the display surface) will not change. It can be understood that in the embodiment of the present application, when the Demux circuit in the array substrate includes more thin film transistors, it means that the array substrate can be used with fewer source chips (source ICs). When the number of source ICs is reduced, the width of the lower frame used to cover and shield the source ICs can be further reduced, so as to further reduce the width of the frame of the display device.

With reference to FIG. 1, an orthographic projection of the first active layer 22 on the substrate 10 and an orthographic projection of the second active layer 42 on the substrate 10 at least partially overlap. It can be understood that the arrangement where an orthographic projection of the first active layer 22 on the substrate 10 partially overlaps with the orthographic projection of the second active layer 42 on the substrate 10, when compared with the technical solution in which the orthographic projection of the first active layer 22 on the substrate 10 and the orthographic projection of the second active layer 42 on the substrate 10 does not overlap at all, can reduce the occupied area of the Demux circuit in the horizontal direction (parallel to the display surface), thereby facilitating the realization of narrow border display. It can be understood that since the first source electrode 31 and the first drain electrode 23 need to be electrically connected to the first active layer 22 from both sides of the second active layer 42 respectively, it is difficult to completely overlap the orthographic projection of the first active layer 22 on the substrate 10 and the orthographic projection of the second active layer 42 on the substrate 10.

For example, for an area of an overlapping portion of the orthographic projection of the first active layer 22 on the substrate 10 and the orthographic projection of the second active layer 42 on the substrate 10, a ratio of the area of the overlapping portion to the area of the orthographic projection of the first active layer 22 on the substrate 10 or to the area of the orthographic projection of the second active layer 42 on the substrate 10 may be 10% to 99%, such as 10%, 20%, 30%, 40%, 50%, 60%, 70%, 80%, 90%, 95%, 99%, etc.

With reference to FIG. 1, a first via hole 91 and a second via hole 92 are formed on the second interlayer dielectric layer 80, the second gate insulating layer 70, and the first interlayer dielectric layer 60. The first source electrode 31 is connected to the first active layer 22 through the first via hole 91, and the first drain electrode 23 is connected to the first active layer 22 through the second via hole 92.

A third via hole 93 and a fourth via hole 94 are formed on the second interlayer dielectric layer 80 and the second gate insulating layer 70. The second source electrode 32 is connected to the second active layer 42 through the third via hole 93. The second drain electrode 43 is connected to the second active layer 42 through the fourth via hole 94.

With reference to FIG. 1, the array substrate 100 further includes a first passivation layer 101, a planarization layer 102 and a second passivation layer 104. The first passivation layer 101 covers the source-drain electrode layer. The planarization layer 102 is disposed on one side of the first passivation layer 101 away from the source-drain electrode layer. The second passivation layer 104 is disposed on one side of the planarization layer 102 away from the first passivation layer 101.

Figure 3:
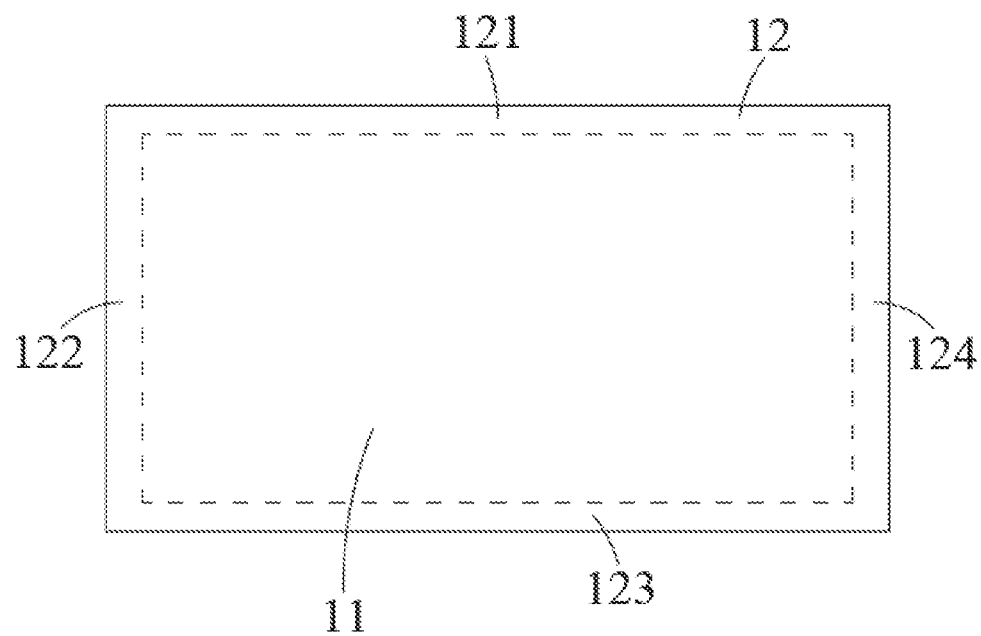
FIG. 3 is a schematic top view of a substrate provided by an embodiment of the present application.

With reference to FIG. 1 and FIG. 3, the substrate 10 includes a display area 11 and a non-display area 12. A first gate 21, a second gate 41, a first active layer 22, a second active layer 42, a first source electrode 31, the second source electrode 32, the first drain electrode 23, and the second drain electrode 43 all correspond to the non-display area 12 of the substrate 10.

Figure 4:
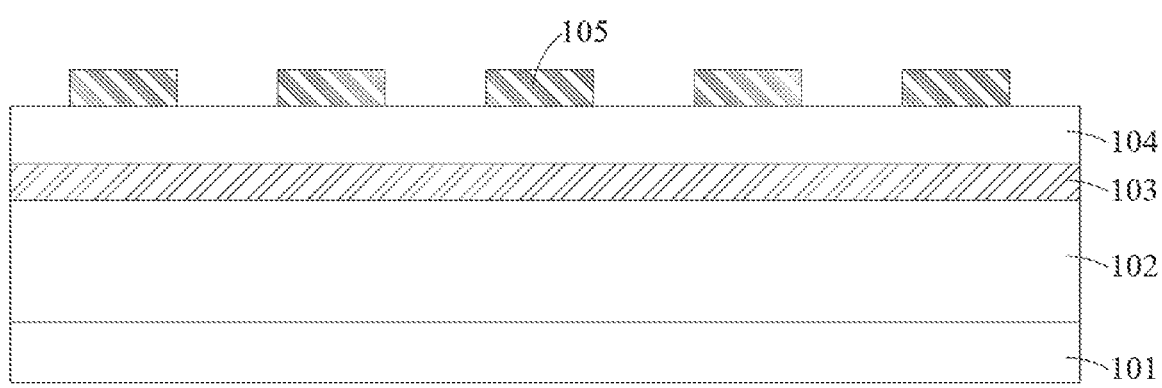
FIG. 4 is a schematic diagram of partial structural layers of the display area of the array substrate provided by the embodiment of the present application.

With reference to FIGS. 1 and 4, the array substrate 100 also includes a common electrode 103 and a pixel electrode 105. The common electrode 103 is disposed between the planarization layer 102 and the second passivation layer 104. The pixel electrode 105 is disposed on one side of the second passivation layer 104 away from the planarization layer 102. Both the common electrode 103 and the pixel electrode 105 correspond to the display area 11 of the substrate 10.

Referring to FIG. 3, the non-display area 12 can be arranged around the display area 11. The display area 11 can be rectangular. The non-display area 12 can include a first area 121, a second area 122, a third area 123, and a fourth area 124 connected end to end. In particular, the first area 121 is formed opposite the third area 123, and the second area 122 is formed opposite to the fourth area 124. It can be understood that when the array substrate 100 is applied to a television, the first area 121 is located above the display area 11, the third area 123 is located below the display area 11, the second area 122 is located on the left side of the display area 11, the fourth area 124 is located on the right side of the display area 11, and the Demux circuit can be arranged in the third area 123. The embodiment of the present application provides improvements by changing the position of the gate and/or the active layer in the Demux circuit, so that the occupied area of the Demux circuit can be reduced, and the width of the third region 123 can be reduced. Since the third region 123 is formed in the position of the lower frame of the TV so that the width of the lower frame can be reduced to achieve a narrow frame display effect.

For example, the substrate 10 may be a flexible substrate 10 or a rigid substrate 10. The rigid substrate 10 may be glass, and the flexible substrate 10 may be polyimide (Pi) or the like.

For example, the materials of the first gate 21 and the second gate 41 can both be metal. In some embodiments, the respective materials of the first gate 21 and the second gate 41 can both include at least one of metals aluminum (Al), Silver (Ag), tungsten (W), copper (Cu), nickel (Ni), chromium (Cr), molybdenum (Mo), titanium (Ti), platinum (Pt), tantalum (Ta) and neodymium (Nd), etc.

For example, the respective materials of the first active layer 22 and the second active layer 42 may each include at least one of oxide semiconductor, amorphous silicon (a-Si) and low temperature polysilicon (LTPS), wherein the oxide semiconductor may include at least one of indium gallium zinc oxide (IGZO), zinc tin oxide (ZTO), and indium tin zinc oxide (ITZO).

For example, the first source electrode 3 1, the second source electrode 3 2, the first drain electrode 23, and the second drain electrode 43 may all be metal. In some embodiments, the first source electrode 3 1, the second source electrode 32, the first drain electrode 23 and the second drain electrode 43 may all include at least one of metals such as, aluminum (Al), silver (Ag), tungsten (W), copper (Cu), nickel (Ni), chromium (Cr) molybdenum (Mo), titanium (Ti), platinum (Pt), tantalum (Ta), and neodymium (Nd).

For example, the respective materials of the first gate insulating layer 50, the second gate insulating layer 70, the first interlayer dielectric layer 60, and the second interlayer dielectric layer 80 may all include at least one of silicon nitride ($SiN_x$), silicon oxide ($SiO_x$), and silicon oxynitride ($SiO_xN_y$).

For example, the materials of the common electrode 103 and the pixel electrode 105 may both include transparent conductive metal oxide. In some embodiments, the transparent conductive metal oxide may be indium tin oxide (ITO).

For example, the array substrate 100 of the embodiment of the present application can be applied to a Fringe Field Switching (FFS) liquid crystal display panel.

Figure 5:
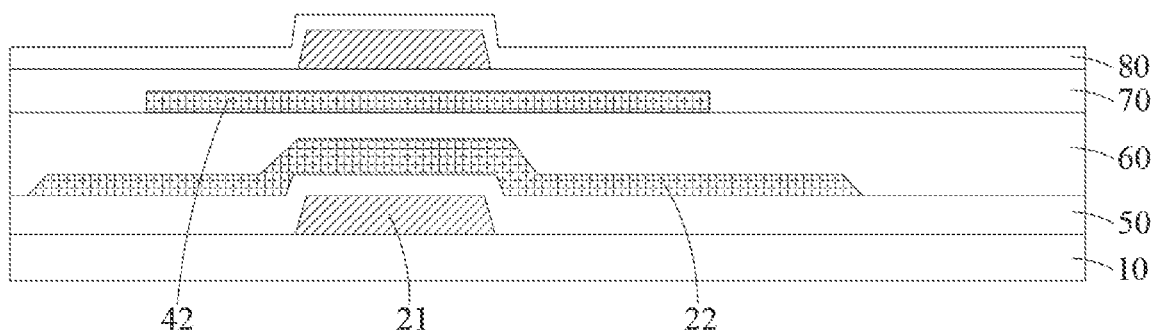
FIG. 5 is a schematic diagram showing a result of forming a second interlayer dielectric layer according to an embodiment of the present application.
Figure 6:
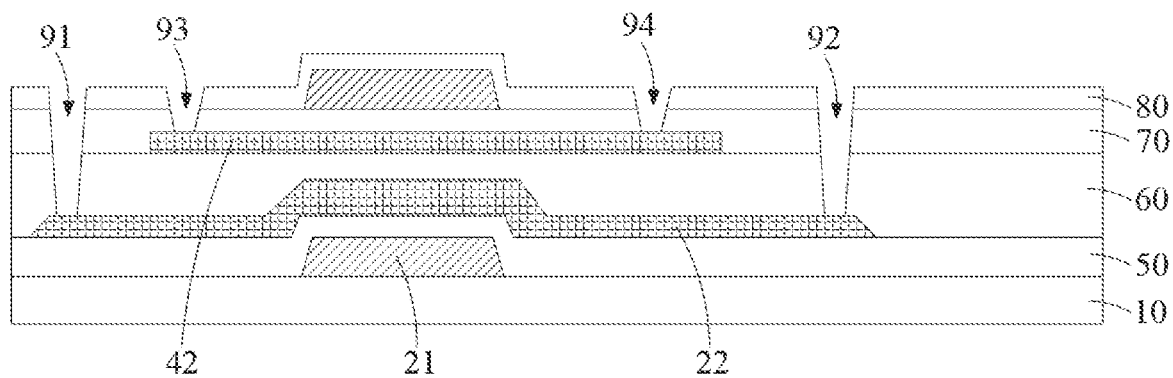
FIG. 6 is a schematic diagram showing a result of forming the first via hole, the second via hole, the third via hole, and the fourth via hole according to the embodiment of the present application.

With reference to FIG. 5 and FIG. 6, and in conjunction with FIG. 1, the embodiment of the present application also provides a method for manufacturing an array substrate, which can be used to manufacture the array substrate in any of the above embodiments. The method for manufacturing the array substrate may include:

forming a substrate 10;

forming a first gate 21 on the substrate 10;

forming a first gate insulating layer 50 on the first gate 21 and the substrate 10, the first gate insulating layer 50 covers the first gate 21;

forming a first active layer 22 on the first gate insulating layer 50;

forming a first interlayer dielectric layer 60 on the first active layer 22 and the first gate insulating layer 50, the first interlayer dielectric layer 60 covers the first active layer 22;

forming a second active layer 42 on the first interlayer dielectric layer 60;

forming a second gate insulating layer 70 on the second active layer 42 and the first interlayer dielectric layer 60, the second gate insulating layer 70 covering the second active layer 42;

forming a second gate 41 on the second gate insulating layer 70;

forming a second interlayer dielectric layer 80 on the second gate 41 and the second gate insulating layer 70, the second interlayer dielectric layer 80 covers the second gate 41;

A source-drain electrode layer is formed on the second interlayer dielectric layer 80. The source-drain electrode layer includes a first source electrode 31, a second source electrode 32, a first drain electrode 23, and a second drain electrode 43. In particular, the first source electrode is electrically connected to the second source electrode 32. The first source electrode 31 is electrically connected to one end of the first active layer 22. The second source electrode 32 is electrically connected to one end of the second active layer 42. The first drain electrode 23 is electrically connected to the other end of the first active layer 22. The second drain electrode 43 is electrically connected to the other end of the second active layer 42.

With reference to FIGS. 5 and 6, after forming the second interlayer dielectric layer 80 on the second gate 41 and the second gate insulating layer 70, and forming the source-drain electrode layer on the second interlayer dielectric layer 80, the manufacturing method of the array substrate in the embodiment of the present application further includes:

forming spaced apart a first via hole 91 and a second via hole 92 on the first interlayer dielectric layer 60, the second gate insulating layer 70, and the second interlayer dielectric layer 80 and forming spaced apart a third via hole 93 and a fourth via hole 94 on the second gate insulating layer 70 and the second interlayer dielectric layer 80.

The first source electrode 31 is connected to the first active layer 22 through the first via hole 91. The first drain electrode 23 is connected to the first active layer 22 through the second via hole 92. The second source electrode 32 is connected to the second active layer 42 through the third via hole 93. The second drain electrode 43 is connected to the second active layer 42 through the fourth via hole 94.

For example, the first via hole 91, the second via hole 92, the third via hole 93, and the fourth via hole 94 may be formed in the same photomask process.

With reference to FIGS. 1 and 3, the substrate 10 includes a display area 11 and a non-display area 12. A first gate 21, a second gate 41, a first active layer 22, a second active layer 42, a first source electrode 31, the second source electrode 32, the first drain electrode 23, and the second drain electrode 43 all correspond to the non-display area 12 of the substrate 10.

With reference to FIGS. 3 and 4, after the source-drain electrode layer are formed on the second interlayer dielectric layer 80, the manufacturing method of the array substrate further includes:

forming the first passivation layer 101 on the source-drain electrode layer and the second interlayer dielectric layer 80, the first passivation layer 101 covering the source-drain electrode electrode layer;

forming a planarization layer 102 on one side of the first passivation layer 101 away from the source-drain electrode layer;

forming a common electrode 103 on the planarization layer 102, the common electrode 103 is formed corresponding to the display area 11 of the substrate 10;

forming the second passivation layer 104 on one side of the common electrode 103 away from the planarization layer 102, where the second passivation layer 104 covers the common electrode 103;

forming a pixel electrode 105 on one side of the second passivation layer 104 away from the planarization layer 102, where the pixel electrode 105 is disposed corresponding to the display area 11 of the substrate 10.

For example, the first gate 21, the first active layer 22, the second gate 41, the second active layer 42, the first drain electrode 23, the second drain electrode 43, the first source electrode 3 1, the second source electrode 32, the common electrode 103, the pixel electrode 105, the first interlayer dielectric layer 60, the second gate insulating layer 70, and the second interlayer dielectric layer 80 are all manufactured through processes of film formation, exposure, and etching. Wherein, the first drain electrode 23, the second drain electrode 43, the first source electrode 31, and the second source electrode 32 can share a photomask for exposure. Each of the first gate 21, the first active layer 22, the second gate 41, the second active layer 42, the common electrode 103, and the pixel electrode 105 needs a mask for exposure. In addition, the first via hole 91 and the second via hole 92 on the first interlayer dielectric layer 60, the second gate insulating layer 70, and the second interlayer dielectric layer 80 and the third via hole 93 and the fourth via hole 94 on the second gate insulating layer 70 and the second interlayer dielectric layer 80 needs one photomask is for exposure. Therefore, the manufacturing method of the array substrate according to the embodiment of the present application needs to use 8 photomasks in total.

The manufacturing method of the array substrate provided in the embodiment of the present application can not only reduce the size of the Demux circuit (that is, reduce the occupied area of the Demux circuit in the horizontal direction), so that the display device including the array substrate can realize narrow-frame display. In addition, the manufacturing method of the array substrate provided in the embodiment of the present application can also be used to make display devices with various frame sizes. By using the same set of photomasks and matching different module design schemes, the requirements of different frames can be met, and the time and cost spent on developing different products can be reduced.

Embodiments of the present application further provide a display device, including the array substrate 100 in any of the above embodiments or an array substrate 100 manufactured by the method for manufacturing an array substrate in any of the above embodiments.

For example, the display device may be a liquid crystal display device or an organic light emitting diode display (OLED) device. When the display device is a liquid crystal display device, the display device may also include a color filter substrate and a liquid crystal layer disposed between the array substrate 100 and the color filter substrate. When the display device is an OLED device, the display device may also include OLED devices disposed on and electrically connected to the array substrate 100.

The array substrate, the manufacturing method thereof, and the display device provided by the embodiments of the present application have been introduced in detail above. In this paper, specific examples are used to illustrate the principles and implementation methods of the present application, and the descriptions of the above embodiments are only used to help understand the present application. At the same time, for those skilled in the art, based on the idea of this application, there will be changes in the specific implementation and application scope. In summary, the content of this specification should not be construed as limiting the application.

What is claimed is:

1. An array substrate, comprising a substrate, a first gate, a first gate insulating layer, a first active layer, a first interlayer dielectric layer, a second active layer, a second gate insulating layer, a second gate, a second interlayer dielectric layer, and a source-drain electrode layer, which are stacked sequentially;
   wherein the source-drain electrode layer includes a first source electrode, a second source electrode, a first drain electrode, and a second drain electrode;
   wherein the first source electrode is electrically connected to the second source electrode, the first source electrode is electrically connected to one end of the first active layer, the second source electrode is electrically connected to one end of the second active layer, and the first drain electrode is electrically connected to the other end of the first active layer, and the second drain electrode is electrically connected to the other end of the second active layer;
   wherein lower surfaces of the first source electrode, the second source electrode, the first drain electrode and the second drain electrode are at a same height and in contact with an upper surface of the second interlayer dielectric layer.

2. The array substrate according to claim 1, wherein when a current channel of the first active layer is turned on, a current channel of the second active layer is disconnected, and an electrical signal of the first source electrode is transmitted to the first drain electrode through the first active layer;
   when the current channel of the second active layer is turned on, the current channel of the first active layer is disconnected, and an electrical signal of the second source electrode is transmitted to the second drain electrode through the second active layer.

3. The array substrate according to claim 1, wherein an orthographic projection of the first gate on the substrate and an orthographic projection of the second gate on the substrate at least partially overlap.

4. The array substrate according to claim 1, wherein an orthographic projection of the first active layer on the substrate and an orthographic projection of the second active layer on the substrate at least partially overlap.

5. The array substrate according to claim 1, wherein a first via hole and a second via hole are formed in the second interlayer dielectric layer, the second gate insulating layer, and the first interlayer dielectric layer, the first source electrode is connected to the first active layer through the first via hole, the first drain electrode is connected to the first active layer through the second via hole;
   a third via hole and a fourth via hole are formed in the second interlayer dielectric layer and the second gate insulating layer, the second source electrode is connected to the second active layer via the third via hole, and the second drain electrode is connected to the second active layer through the fourth via hole.

6. The array substrate according to claim 1, wherein the array substrate further comprises a first passivation layer, a planarization layer, and a second passivation layer; the first passivation layer covers the source-drain electrode layer, the planarization layer is arranged on one side of the first passivation layer away from the source-drain electrode layer, and the second passivation layer is arranged on one side of the planarization layer away from the first passivation layer.

7. The array substrate according to claim 6, wherein the substrate comprises a display area and a non-display area, the first gate, the second gate, the first active layer, the second active layer, the first source electrode, the second source electrode, the first drain electrode, and the second drain electrode all correspond to the non-display area of the substrate.

8. The array substrate according to claim 7, wherein the array substrate further comprises a common electrode and a pixel electrode, the common electrode is arranged between the planarization layer and the second passivation layer, the pixel electrode is disposed on one side of the second passivation layer away from the planarization layer, and both the common electrode and the pixel electrode correspond to the display area of the substrate.

9. A display device comprising the array substrate according to claim 1;
   wherein the display device is a liquid crystal display device or an organic light emitting diode display (OLED) device.

10. The display device according to claim 9, wherein when a current channel of the first active layer is turned on, a current channel of the second active layer is disconnected, and an electrical signal of the first source electrode is transmitted to the first drain electrode through the first active layer;
    when the current channel of the second active layer is turned on, the current channel of the first active layer is disconnected, and an electrical signal of the second source electrode is transmitted to the second drain electrode through the second active layer.

11. The display device according to claim 9, wherein an orthographic projection of the first gate on the substrate and an orthographic projection of the second gate on the substrate at least partially overlap.

12. The display device according to claim 9, wherein an orthographic projection of the first active layer on the substrate and an orthographic projection of the second active layer on the substrate at least partially overlap.

13. The display device according to claim 9, wherein a first via hole and a second via hole are formed in the second interlayer dielectric layer, the second gate insulating layer, and the first interlayer dielectric layer, the first source electrode is connected to the first active layer through the first via hole, the first drain electrode is connected to the first active layer through the second via hole;
    a third via hole and a fourth via hole are formed in the second interlayer dielectric layer and the second gate insulating layer, the second source electrode is connected to the second active layer via the third via hole, and the second drain electrode is connected to the second active layer through the fourth via hole.

14. The display device according to claim 9, wherein the array substrate further comprises a first passivation layer, a planarization layer, and a second passivation layer; the first passivation layer covers the source-drain electrode layer, the planarization layer is arranged on one side of the first passivation layer away from the source-drain electrode layer, and the second passivation layer is arranged on one side of the planarization layer away from the first passivation layer.

15. The display device according to claim 14, wherein the substrate comprises a display area and a non-display area, the first gate, the second gate, the first active layer, the second active layer, the first source electrode, the second source electrode, the first drain electrode, and the second drain electrode all correspond to the non-display area of the substrate.

16. The display device according to claim 15, wherein the array substrate further comprises a common electrode and a pixel electrode, the common electrode is arranged between the planarization layer and the second passivation layer, the pixel electrode is disposed on one side of the second passivation layer away from the planarization layer, and both the common electrode and the pixel electrode correspond to the display area of the substrate.

17. The array substrate according to claim 3, wherein a ratio of an area of an overlapping portion to an area of the orthographic projection of the first gate on the substrate or to an area of the orthographic projection of the second gate on the substrate is in a range from 10% to 100%, wherein the overlapping portion is an overlapping portion of the orthographic projection of the first gate on the substrate and the orthographic projection of the second gate on the substrate.

* * * * *